United States Patent [19]
Son

[11] Patent Number: 5,914,624
[45] Date of Patent: *Jun. 22, 1999

[54] SKEW LOGIC CIRCUIT DEVICE

[75] Inventor: Jin Seung Son, Ichon, Rep. of Korea

[73] Assignee: Hyundai Electronics Industries Co., Ltd., Ichon-shi, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/881,507

[22] Filed: Jun. 24, 1997

[30] Foreign Application Priority Data

Jun. 24, 1996 [KR] Rep. of Korea ....................... 96-23273
Jun. 29, 1996 [KR] Rep. of Korea ....................... 96-25729

[51] Int. Cl.$^6$ ..................................................... H03H 11/26
[52] U.S. Cl. .......................... 327/264; 327/172; 327/176; 327/398; 327/400; 327/285
[58] Field of Search ..................................... 327/170, 172, 327/173, 176, 175, 382, 389, 398, 400, 264, 263, 261, 285, 284; 326/58, 27, 17

[56] References Cited

U.S. PATENT DOCUMENTS

| | | | |
|---|---|---|---|
| 5,073,874 | 12/1991 | Yamada et al. ......................... | 365/226 |
| 5,081,374 | 1/1992 | Davis ..................................... | 307/451 |
| 5,121,014 | 6/1992 | Huang .................................... | 327/285 |
| 5,220,209 | 6/1993 | Seymour ................................ | 307/443 |
| 5,410,262 | 4/1995 | Kang ..................................... | 327/108 |
| 5,672,990 | 9/1997 | Chaw ..................................... | 327/172 |
| 5,708,396 | 1/1998 | Mizuno .................................. | 327/264 |
| 5,723,993 | 3/1998 | Cha ....................................... | 327/172 |
| 5,734,282 | 3/1998 | Choi et al. ............................. | 327/176 |

FOREIGN PATENT DOCUMENTS 0 347 759 A2  12/1989  European Pat. Off. .

*Primary Examiner*—Timothy P. Callahan
*Assistant Examiner*—Jung Ho Kim
*Attorney, Agent, or Firm*—Thelen Reid & Priest LLP

[57] ABSTRACT

A skew logic circuit device comprises:

two or more inverters which are connected in series with one another between an input line and an output line; first control switching means for switching voltage from a first power voltage source toward an output terminal of every odd inverter; second control switching means for switching voltage from a second power voltage source toward an output terminal of every even inverter; and edge signal generating means for sequentially controlling the operation of the first and second control switching means by the edge signal of a fixed pulse width caused by logically combining the signal from the input line.

6 Claims, 5 Drawing Sheets

SKEW LOGIC CIRCUIT DEVICE

BACKGROUND OF THE INVENTION

1. Field of the Invention

The present invention relates to a skew logic circuit device for use in a semiconductor memory device. More particularly, it relates to a skew logic circuit device which prevents the disable path of an output signal caused by buffering an input signal, from responding slowly.

2. Discussion of Related Art

As shown in FIG. 1, a conventional circuit of an input buffer which funtions a skew logic operation, comprises first to fifth inverters (IV1 to IV5), which are, in series, connected with one another, between an input terminal (IN) and an output terminal (OUT).

Generally, the inverters are composed of two CMOS-type transistors, and operate as a buffer for buffering an input signal from the outside. Suppose that an NMOS-type transistor of the first, third, and fifth inverters (IV1, IV3, and IV5) is larger in size than PMOS-type transistor, and a PMOS-type transistor of the second and fourth inverters (IV2 and IV4) is larger in size than a NMOS-type transistor.

The operation of the inverters constructed as indicated above will be described, referring to FIG. 2 showing operation timing. If (a) pulse signal is inputted to the input terminal (IN), a (b) pulse signal inverted through the first inverter (IV1) is transmitted to a first node (N1). The (b) pulse signal is quickly transmitted at the enable path, but slowly transmitted at the disable path. (c) to (f) pulse signals of FIG. 2 are the pulse signals at the respective nodes, which are outputted through the second to fifth inverters (IV2 to IV5). When we compare the (f) pulse signal which is outputted to the output terminal (OUT) with the (a) pulse signal which is inputted to the input terminal (IN), the pulse width of the (f) pulse signal which is an output signal, is much broader than that of the (a) pulse signal which is an input signal. This is because the pulse signal which is outputted through the respective inverters (IV1 to IV5), is transmitted quickly at the enable path, but slowly at the disable path, so that the output pulse width extends substantially. When the pulse width of the output pulse signal is broader than that of the input pulse signal, the signal is overlapped during a high speed operation.

SUMMARY OF THE INVENTION

The present invention is directed to a skew logic circuit device that substantially obviates one or more of the problems due to limitations and disadvantages of the related art.

An objective of the present invention is to provide a skew logic circuit device which makes the disable path of an output signal caused by buffering an input signal, respond quickly, in order to prevent the overlapping of the signal.

Additional features and advantages of the invention will be set forth in the description which follows, and in part will be apparent from the description, or may be learned by practice of the invention. The objectives and other advantages of the invention will be realized and attained by the structure indicated in the written description and claims hereof as well as the appended drawings.

To achieve these and other advantages and in accordance with the purpose of the present invention, as embodied and broadly described, the skew logic circuit device includes: two or more inverters which are, in series, connected with one another, between an input line and an output line; first control switching means for switching a voltage from a first power voltage source, toward an output terminal of every odd inverter; second control switching means for switching a voltage from a second power voltage source, toward an output terminal of every even inverter; and edge signal generating means for controlling the operation of the first and second control switching means by the edge signal of a fixed pulse width caused by logically combining the signal from the input line.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 3:
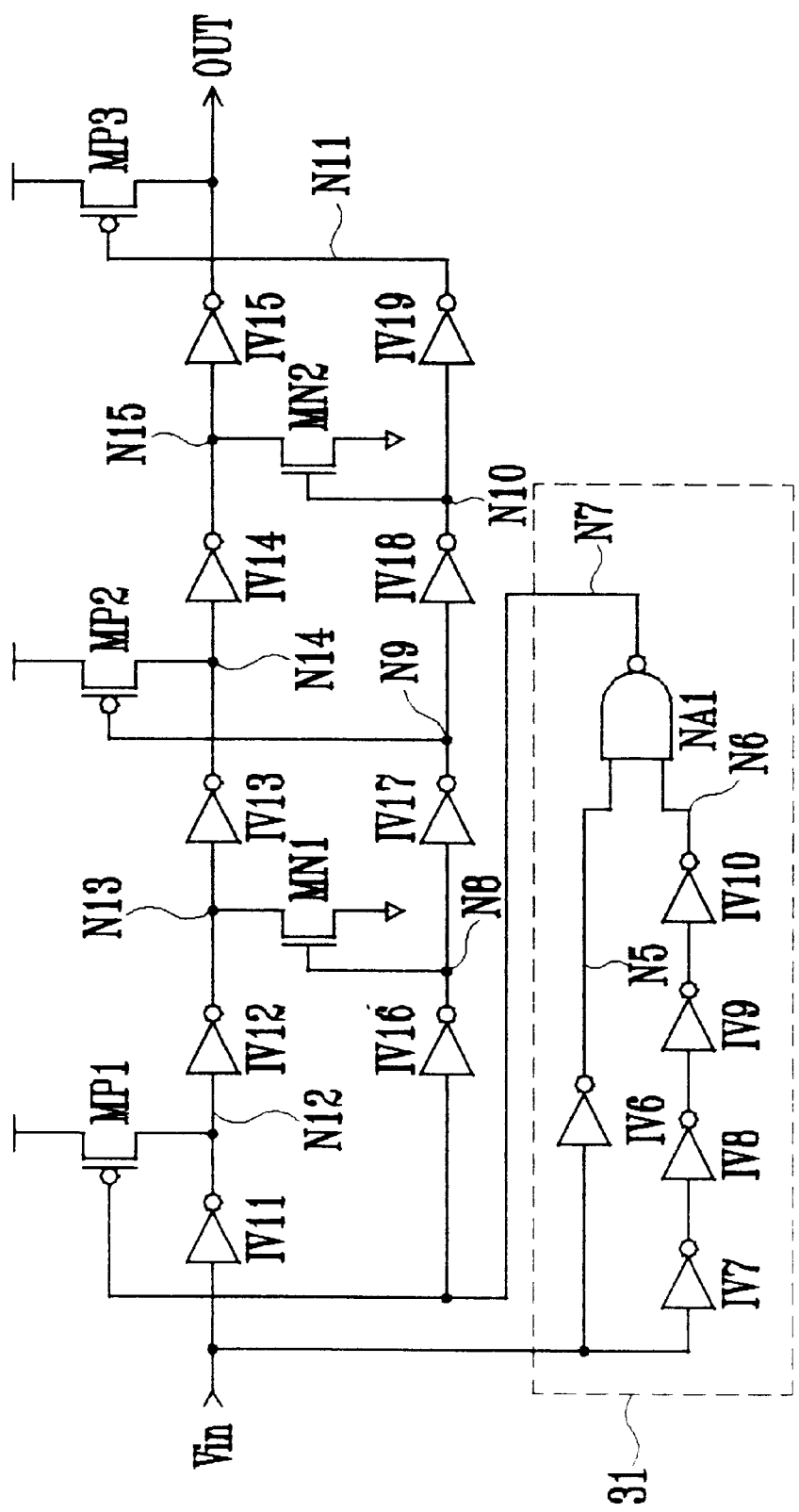
FIG. 3 is a skew logic circuit device according to a first preferred embodiment of the present invention.

FIG. 3 is a circuit diagram of the skew logic circuit device according to the first preferred embodiment of the present invention.

The skew logic circuit device comprises odd inverters (five inverters in FIG. 3) which are, in series, connected with one another, between the input terminal (IN) and the output terminal (OUT). Suppose that among the inverters, NMOS-type transistors of the odd inverters are larger in size than PMOS-type transistors, and PMOS-type transistors of the even inverters are larger in size than NMOS-type transistors. Pulse signals which are outputted through the respective inverters, are transmitted quickly at the enable path, but slowly at the disable path, so that the output pulse width extends substantially. In order to prevent the enlongation, the first preferred embodiment of the present invention includes: first control switching means for switching a power voltage (Vcc), toward an output terminal of the odd inverters; second control switching means for switching a ground voltage (Vss), toward an output terminal of the even inverters; and an edge signal generating unit 31 for sequentially controlling the operation of the first and second control switching means by the edge signal of a fixed pulse width caused by logically combining a signal (N6) which delays the signal of the input line (Vin) during a predetermined time and a signal which inverts the signal of the input line.

The first control switching means comprises PMOS-type transistor, and the second control switching means comprises NMOS-type transistor. The edge signal generating unit 31 comprises: a sixth inverter (IV6) which is connected between the input terminal (IN) and a fifth node (N5); seventh to tenth inverters (IV7 to IV10) which are, in series, connected with one another, between the input terminal (IN) and a sixth node (N6); and a first NAND gate (NA1) which logically operates the signals from the fifth node (N5) and sixth node (N6), and then outputs them to a seventh node (N7).

The edge signal generating unit 32 controls the operation of the first and second control switching means, by using the signal which inverts and delays its output signal by means of the inverter.

Figure 4:
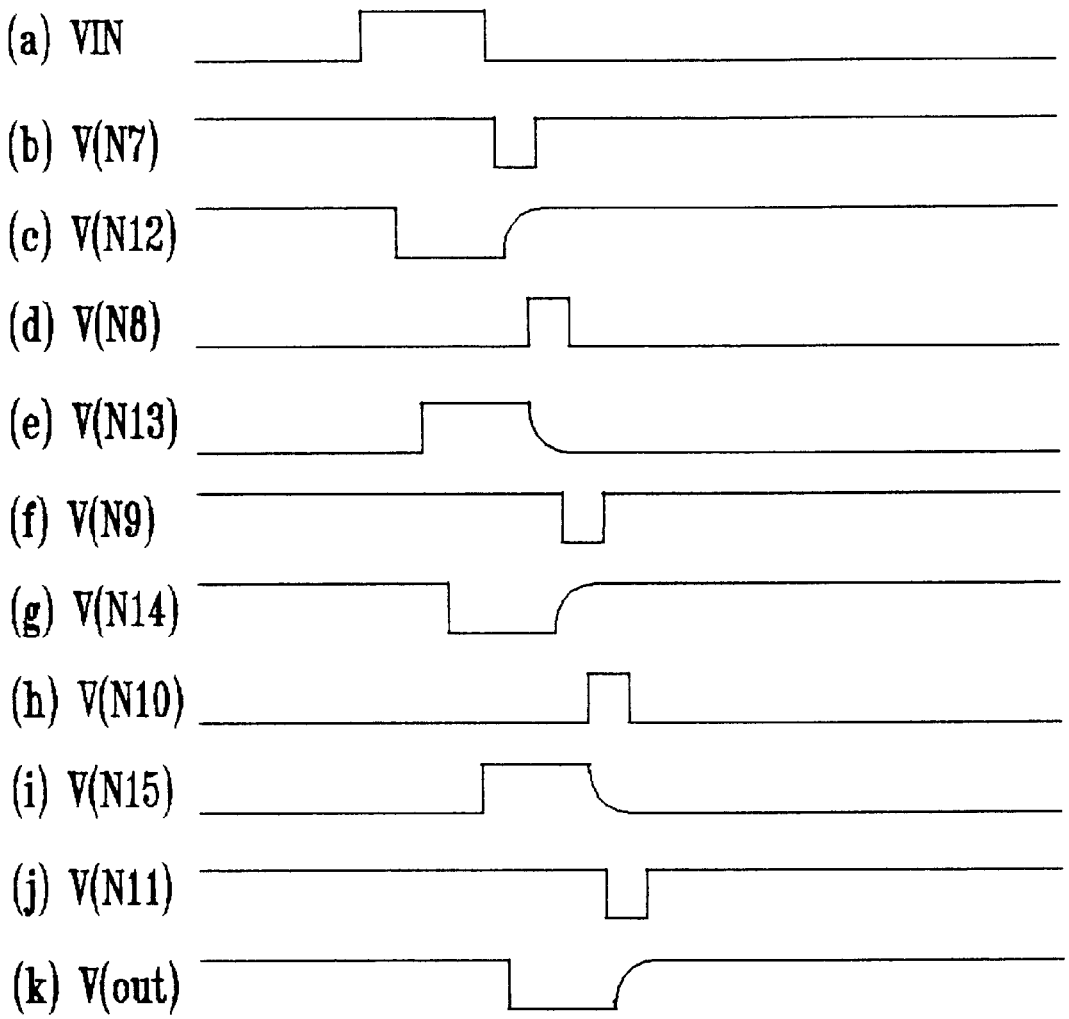
FIG. 4 shows operation timing of each part illustrated in FIG. 3.

The operation of the present invention as constructed above will be described, referring to FIG. 4 showing timing of the operation.

Figure 1:
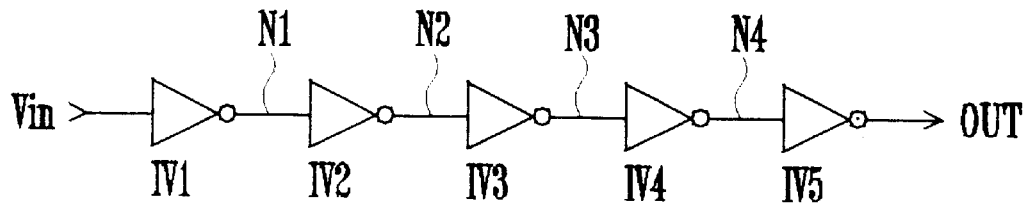
FIG. 1 is a conventional skew logic circuit device.
Figure 2:
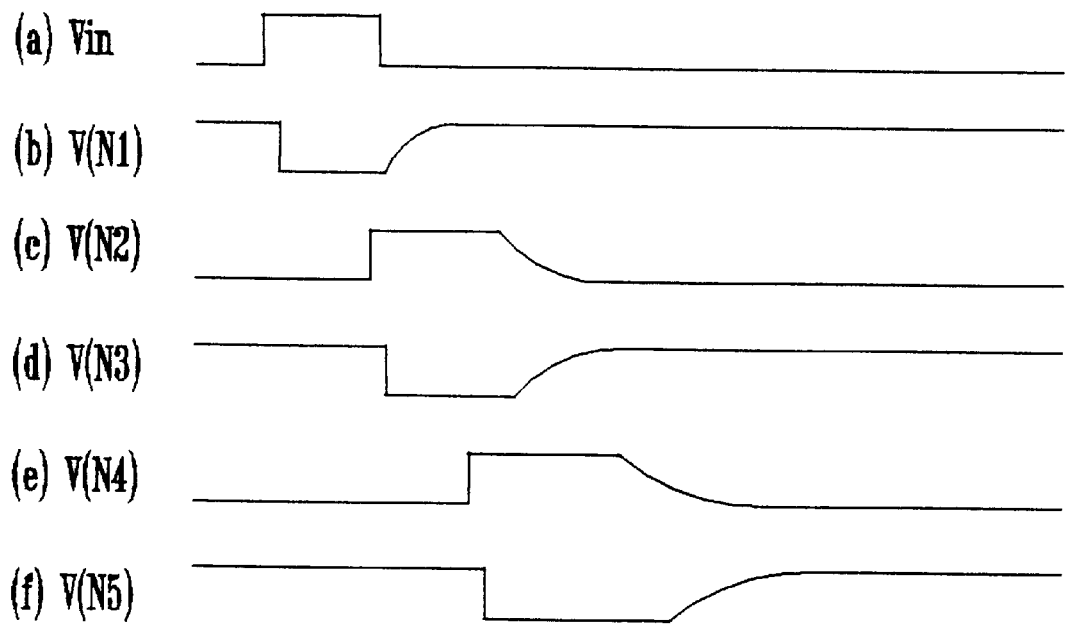
FIG. 2 shows operation timing of each part illustrated in FIG. 1.

The edge signal generating unit 31 comprising the sixth to tenth inverters (IV6 to IV10), and the first NAND gate (NA1), generates the edge signal (b) of a fixed pulse width caused by logically combining the input signal (Vin) (wave (a) of FIG. 4) from the input terminal (IN), to the seventh node (N7). The edge signal (b) generated is applied to a gate of a first PMOS-type transistor (MP1), so that the power voltage (Vcc) is supplied to a twelfth node (N12). The power voltage (Vcc) applied to the twelfth node (N12) by the PMOS-type transistor (MP1), makes the disable path of the pulse signal (c) faster, the pulse signal with an input signal (Vin) inverted by a eleventh inverter (IV11). The pulse signals (e and d) which are outputted to a thirteenth node (N13) and an eighth node (N8), respectively, pass through one inverter from the twelfth node (N12) and seventh node (N7), respectively, so that the phase difference is same. The eighth node (N8) makes the disable path of the pulse signal (e) fast, said pulse signal passes through the gate of a first NMOS-type transistor (MN1), and is then outputted to the thirteenth node (N13). In this manner, a pulse signal (g) of a fourteenth node (N14) by a pulse signal (f) of a ninth node (N9), a pulse signal (i) of a fifteenth node (N15) by a pulse signal (h) of a tenth node (N10), a pulse signal (k) of the output terminal (OUT) by a pulse signal (j) of an eleventh node (N11), their respective disable paths become faster, so that the width of the output pulse (k) is much shorter than that of the conventional output pulse (f) shown in FIG. 2.

An input buffer with the skew logic of the present invention can increase or decrease the pulse width of the seventh to eleventh nodes (N7 to N11), in accordance with a designer's decision. When the layout area is small, the terminal after the thirteenth and eighth nodes (N13 and N8) can be omitted.

Figure 5:
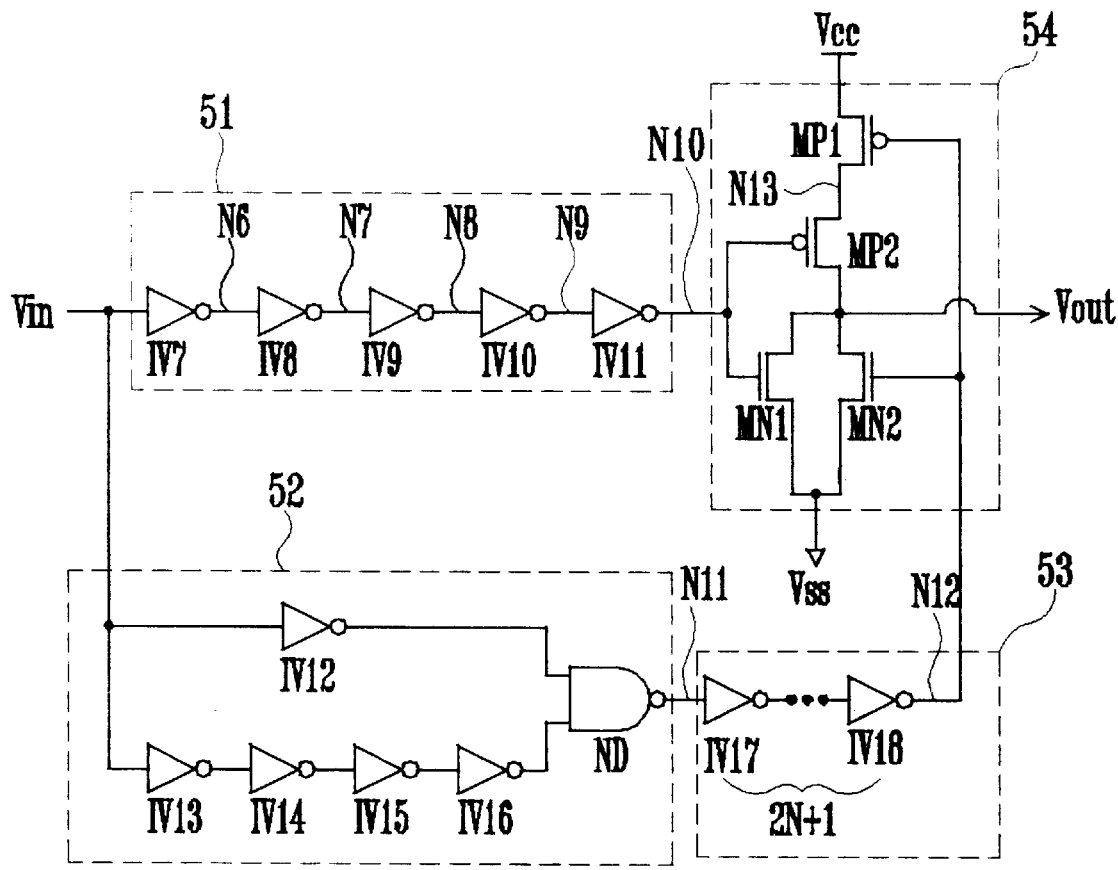
FIG. 5 is a skew logic circuit device according to a second preferred embodiment of the present invention.

FIG. 5 is a skew logic circuit device according to a second preferred embodiment of the present invention. The device includes: a skew logic circuit unit 51 for speeding up the output speed of an input signal which is input to an input line; an edge signal generating circuit unit 52 for generating a new pulse from a disable path of the input signal which is input to the input line; an edge signal delay circuit unit 53 for delaying the edge signal during a fixed time, in order to control the pulse width of an output signal; and a driver unit 54 for NORing the output signal of the skew logic circuit unit 51 and the output signal of the edge signal delay circuit unit 53, in order to make faster a disable path of the output signal which is output to an output terminal.

The skew logic circuit unit 51 where NMOS and PMOS are, in turn, larger in size, comprises five inverters (IV7 to IV11) which are, in series, connected with one another.

The edge signal generating circuit unit 52 comprises: a twelfth inverter (IV12) for inverting the signal which is inputted to the input line, in order to output it to one input terminal of a NAND gate; four inverters (IV13 to IV16) which are, in series, connected with one another, for delaying the signal which is input to the input line during a fixed time, in order to output it to the other input terminal of the NAND gate; and a NAND gate for logically operating the output signal of the twelfth inverter (IV12) and the output signal of the sixteenth inverter (IV16), in order to output them to an input terminal of the edge signal delay circuit unit 53.

The edge signal delay circuit unit 53 comprises an RC time constant having 2N+1 inverters which are connected in series with one another, for delaying an output signal of the edge signal generating circuit unit 52 during a fixed time, and then outputting it to gates of a first PMOS-type transistor (MP1) and a second NMOS-type transistor (MN2) of the driver unit 54, or a resistor and a capacitor.

The driver unit 54 comprises: a first PMOS-type transistor (MP1) with a gate to which the output signal of the edge signal delay circuit unit 53 is applied, and which is connected between a power voltage and one terminal of a second PMOS-type transistor (MP2), for transmitting the power voltage to one terminal of the second PMOS-type transistor (MP2); a second PMOS-type transistor (MP2) with a gate to which the output signal of the skew logic circuit unit 51 is applied, and which is connected between one terminal of the first PMOS-type transistor (MP1) and an output terminal, for transmitting the power voltage (Vcc) which is transmitted by the first PMOS-type transistor (MP1), to the output terminal; a second NMOS-type transistor (MN2) with a gate to which the output signal of the edge signal delay circuit unit 53 is applied, and which is connected between the output terminal and a ground voltage (Vss); and a first NMOS-type transistor (MN1) with a gate to which the output signal of the skew logic circuit unit 51 is applied, and which is connected between the output terminal and the ground voltage (Vss).

Figure 6:
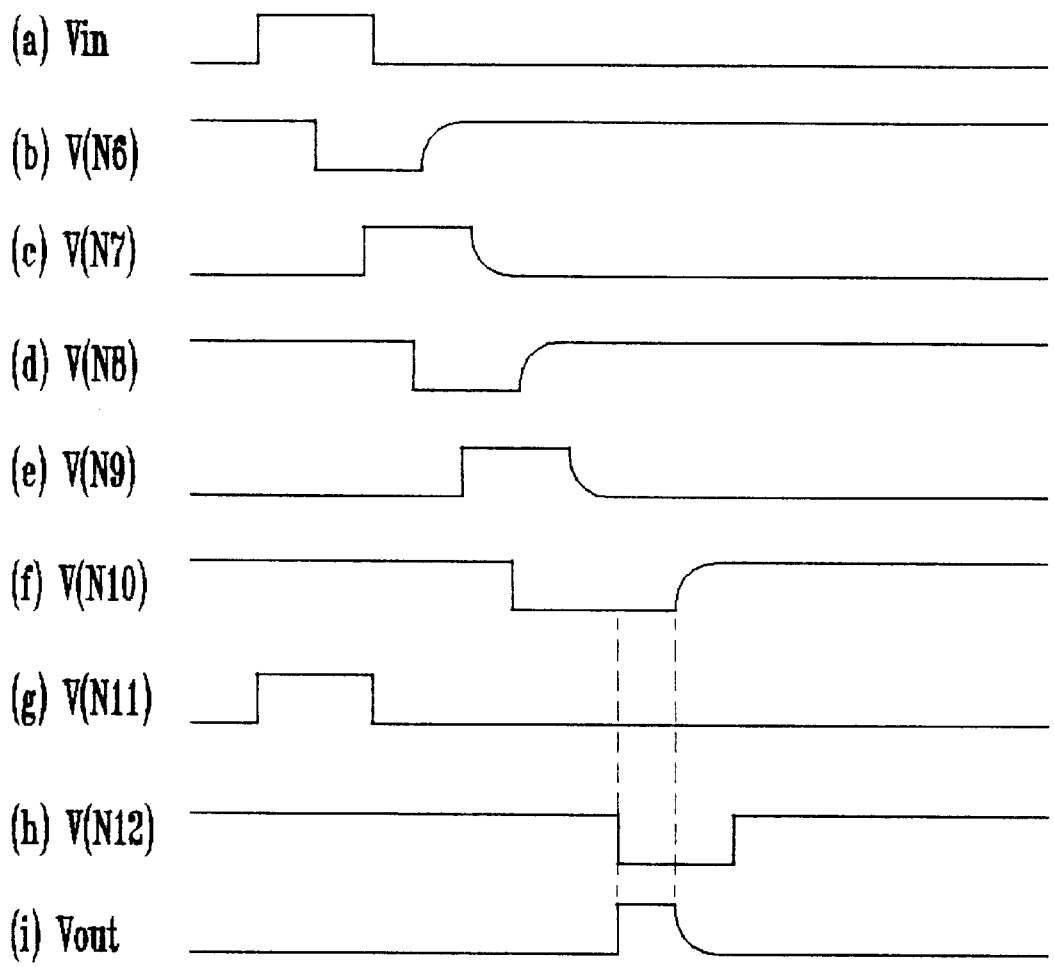
FIG. 6 shows operation timing of each part illustrated in FIG. 5.

The operation of the present invention constructed as above will be described, referring to FIG. 6 showing the timing of the operation.

When the input signal which is inputted to the input line, passes through the skew logic circuit unit 51, wave (f) of FIG. 6 is outputted on the tenth node (N10). This process is the same as the output signal on the fifth node (N5) which is outputted in a conventional skew logic circuit. Therefore, an explanation thereabout will be omitted, as it would be the same as the explanation about the conventional skew logic circuit. The waves on the sixth to ninth nodes (N6 to N9) are shown as (b) to (e) of FIG. 6. However, the pulse width of the output signal of the skew logic circuit unit 51 and the disable path become longer.

The input signal which is inputted to the input line, is input to the input terminals of the twelfth and thirteenth inverters (IV12 and IV13) of the edge signal generating circuit unit 52. The signal which is inputted to the input terminal of the twelfth inverter (IV12), is inverted by the twelfth inverter (IV12), and then inputted to one input terminal of the NAND gate. The signal which is inputted to the thirteenth inverter (IV13), is inverted and delayed by the four inverters (IV13 to IV16) which are connected with one another in series, so that the signal which has the same phase as the input signal, is inputted to the other input terminal of the NAND gate. The output signal of the twelfth inverter (IV12) and the output signal of the sixteenth inverter (IV16) are logically operated by the NAND gate, so that the edge signal is outputted on the eleventh node (N11). The signals which are opposite to each other, are inputted to two input terminals of the NAND gate, so that high signal is always outputted on the eleventh node (N11). The wave of the high signal is shown as (g) of FIG. 6.

The edge signal is inputted to the input terminal of the edge signal delay circuit unit 53 for controlling the pulse width of the output signal. The edge signal delay circuit unit 53 has odd inverters, so that the high signal on the eleventh node (N11), which is delayed and inverted, is outputted on the twelfth node (N12). This process is shown as (h) of FIG. 6.

The driver unit 54 is to make the disable path of the output signal faster which is outputted to the output terminal. The second PMOS-type transistor (MP2) turns on by low signal on the tenth node (N10), and the first NMOS-type transistor (MN1) is open. The first PMOS-type transistor (MP1) turns on and the second NMOS-type transistor (MN2) turns off by low signal on the twelfth node (N12), so that the power voltage (Vcc) is transmitted to the output terminal through the first and second PMOS-type transistors (MP1 and MP2). Only when the low signal is inputted to the two input terminals of the driver unit 54, the output wave appears at the output terminal thereof. (f) of FIG. 6 refers to the output signal of the skew logic circuit unit 51, and (h) refers to the output signal of the edge signal delay circuit unit 53. The output waves appear only at the low paths of (f) and (h). The disable path of the wave of the output signal occurs at a low path other than the position where the disable path moves from low to high of the (f), and the low path of the (h) meet with each other. (i) of FIG. 6 shows that the output signal of the skew logic circuit unit 51 and the output signal of the edge signal delay circuit unit 53 are logically operated by the driver unit 54, and then outputted to the output terminal. The pulse width of the output signal and the disable path become shorter.

As described above, when the input signal is inputted to the input line, the pulse width increases and the disable path becomes longer by the skew logic circuit unit 51 on the tenth node (N10). In order to supplement this process, the edge signal is generated on the eleventh node (N11) through the edge signal generating circuit unit 52, delayed during a fixed time, through the edge signal delay circuit unit 53, in order to control the pulse width of the output signal. Also, the signal on the tenth node (N10) and the signal on the twelfth node (N12) are logically operated through the driver unit 54, so that the disable path becomes faster.

If the input buffer by the skew logic of the present invention is applied to the inside of the semiconductor device, the overlapping of the signals caused by the slow disable path of the output pulse signal during a high speed operation is removed so that stable operation can be attained.

It will be apparent to those skilled in the art that various modifications and variations can be made in a skew logic circuit device of the present invention without departing from the spirit or scope of the invention. Thus, it is intended that the present invention cover the modifications and variations of this invention provided that they come within the scope of the appended claims and their equivalents.

What is claimed is:

1. A skew logic circuit device connected between an input line and an output line, the device comprising:
   a) a main portion, responsive to an input signal on the input line, and including a plurality of delay elements having at least one terminal, for providing an output for the output line, wherein the main portion includes at least two inverters connected in series between the input line and the output line, the series-connected inverters constituting odd inverters and even inverters that alternate with each other in the series; and
   b) adjusting means, responsive to the input line, for adjusting timing of the output signal by providing an adjusting signal to the at least one terminal, wherein the adjusting means includes:
      1) first control switching means for switching a voltage from a first power voltage source to an output terminal of every odd inverter;
      2) second control switching means for switching a voltage from a second power voltage source to an output terminal of every even inverter; and
      3) edge signal generating means for sequentially controlling operation of the first and second control switching means by an edge signal of a fixed pulse width caused by logically combining the input signal from the input line.

2. The device of claim 1, wherein:
the first power voltage source is positive; and
the second power voltage source is negative.

3. The device of claim 2, wherein:
the first control switching means is a PMOS transistor; and
the second control switching means is an NMOS transistor.

4. A skew logic circuit device, comprising:
at least two connected inverters connected in series between an input line and an output line, the series-connected inverters constituting odd inverters and even inverters that alternate with each other in the series;
first control switching means for switching a voltage from a first power voltage source to an output terminal of every odd inverter;
second control switching means for switching a voltage from a second power voltage source to an output terminal of every even inverter; and
edge signal generating means for sequentially controlling operation of the first and second control switching means by an edge signal of a fixed pulse width caused by logically combining a signal from the input line.

5. The device of claim 4, wherein:
the first power voltage source is positive; and
the second power voltage source is negative.

6. The device of claim 5, wherein:
the first control switching means is a PMOS transistor; and
the second control switching means is an NMOS transistor.

* * * * *